United States Patent
Chen et al.

(10) Patent No.: US 8,455,996 B1
(45) Date of Patent: Jun. 4, 2013

(54) WAFER LEVEL PACKAGING METHOD AND A PACKAGING STRUCTURE USING THEREOF

(75) Inventors: Tsung-Lin Chen, Taipei (TW); Jui-Chien Lien, Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/564,749

(22) Filed: Aug. 2, 2012

(30) Foreign Application Priority Data

Mar. 9, 2012  (TW) .............................. 101108031 A

(51) Int. Cl.
*H01L 23/04* (2006.01)

(52) U.S. Cl.
USPC ............. 257/698; 257/E23.001; 257/E33.056

(58) Field of Classification Search
USPC ........................... 257/698, E23.001, E33.056
See application file for complete search history.

(56) References Cited

U.S. PATENT DOCUMENTS

| 2009/0075428 A1* | 3/2009 | Tang et al. ...................... 438/114 |
| 2013/0020719 A1* | 1/2013 | Jung et al. ...................... 257/774 |

OTHER PUBLICATIONS

Jui-Chien Lien et al.; An Integrated Resistance Welding and TSV Process for Microsystems Packaging; Publish: Sep. 19-23, 2011, 37th International Conference on Micro and Nano Engineering in Berlin, Germany.

* cited by examiner

*Primary Examiner* — Kimberly Rizkallah
*Assistant Examiner* — Timor Karimy
(74) *Attorney, Agent, or Firm* — Bacon & Thomas, PLLC

(57) ABSTRACT

The present invention discloses a wafer level packaging method and a packaging structure for packaging a first wafer and a second wafer. The first wafer has a back side and an active side, and further, the active side of the first wafer has a MEMS element. The step of forming two through silicon vias is performed first. A first electrical interconnect and a first bonding ring are formed on the active side of the first wafer. The former connects with one of the through silicon vias, the later surrounds the MEMS element and connects with the other of the through silicon vias. The step of forming a second bonding ring and a second electrical interconnect is then performed. And then, a voltage will be applied to the through silicon vias through the back side of the first wafer.

20 Claims, 19 Drawing Sheets

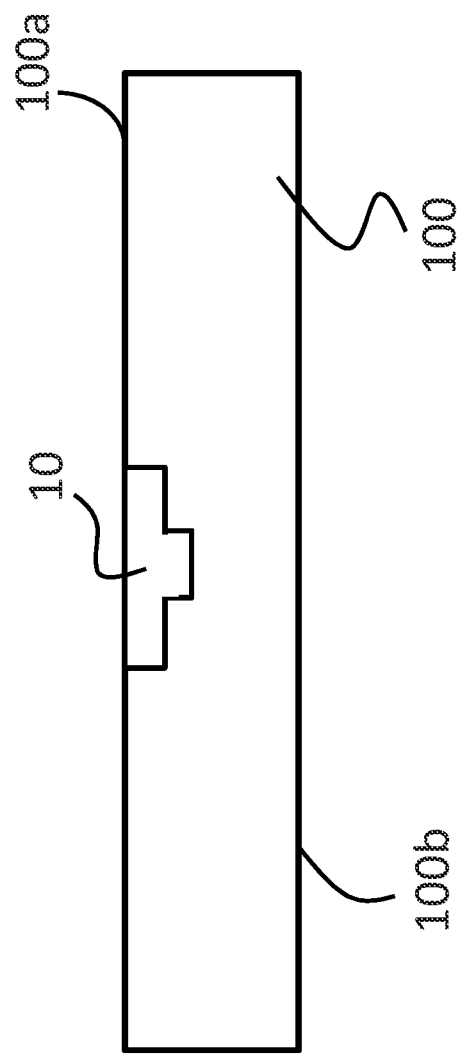

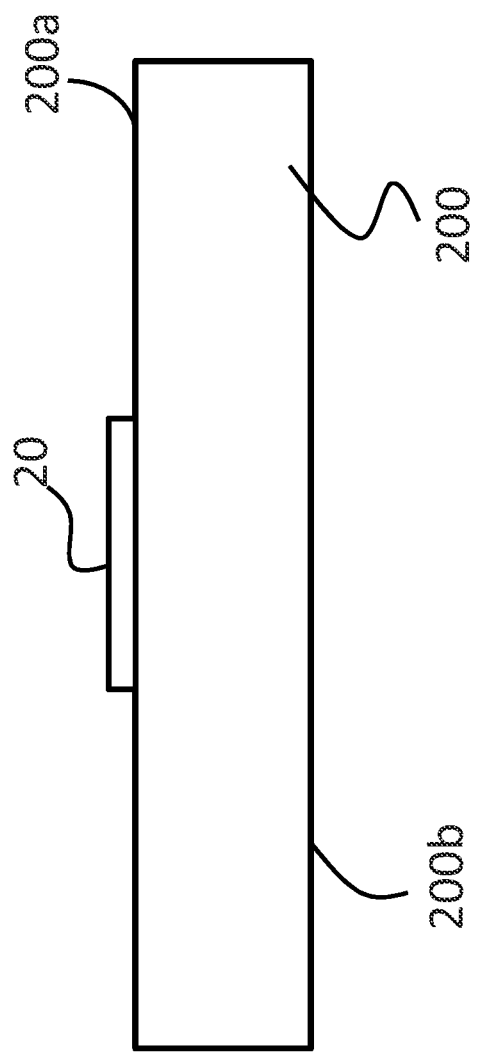

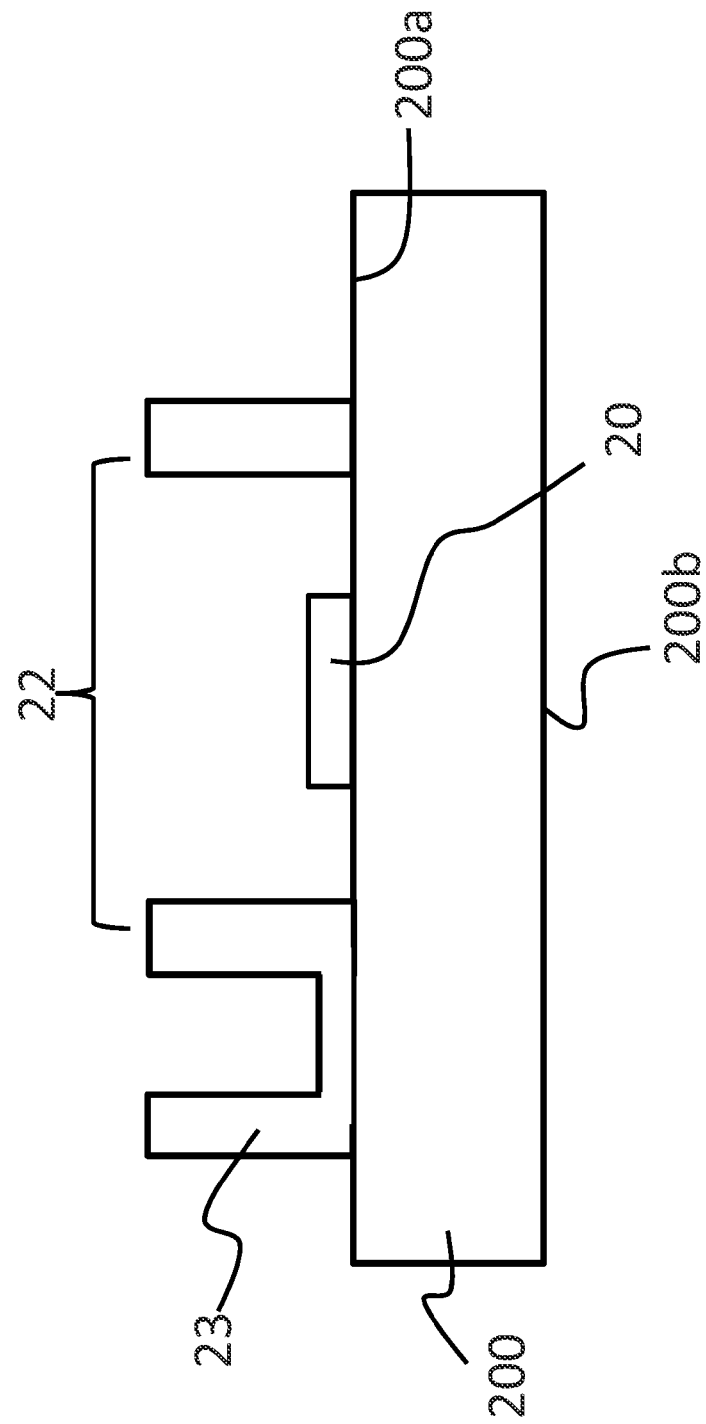

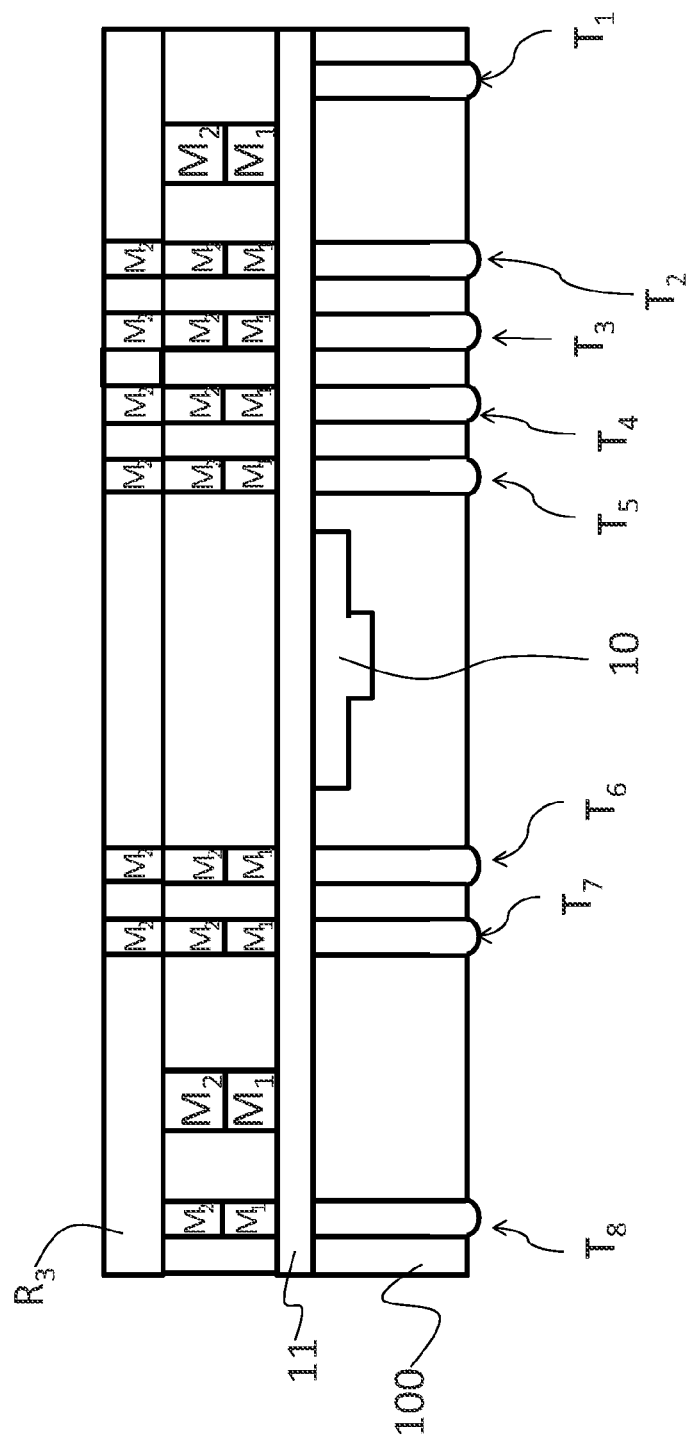

WAFER LEVEL PACKAGING METHOD AND A PACKAGING STRUCTURE USING THEREOF

BACKGROUND OF THE INVENTION

1. Field of the Invention

The present invention relates to a wafer level packaging method, more particularly to a wafer level packaging method and a packaging structure by using the resistance welding principle to partially heat the contact surface between two wafers.

2. Description of the Prior Art

Under the prerequisite for the circumstances of light, thin, short, small consuming electronic product right now, the microelectromechanical systems (MEMS) product has become one of the main products. The MEMS combines many research technologies, such as the electrical engineering, electronic engineering, information, mechanical engineering, photoelectric engineering, material, biochemistry and control etc., namely the MEMS gather the microelectronic and micro-processing technology based on silicon, which nearly change every product category thoroughly, and make people realize the intact single chip system. They have development potentiality and perspective research and development field in the future, it is expected to bring great influence to the industry in the 21st century.

The MEMS packaging is mainly used in the environmental protection, electronic signal transmission, machinery support and heat treatment path etc. There are many packaging technologies, wherein, the wafer level packaging technology is one of the main developing directions in the MEMS packaging. However, due to the diversification, of the MEMS packaging and the requirement of environment, thus the challenge of the MEMS packaging is greater than the microelectronic systems packaging.

The so-called wafer level packaging is to cut for manufacturing the single element after all or most packaging test procedures are finished on the wafer directly, which can reduce the packaging and testing cost tremendously. In addition, another advantage of wafer level packaging technology is to adopt the whole batch operation. Thus, when the wafer size is larger, more packaging number per batch will be obtained. The cost will be further reduced, which meets the trend from 8" to 12" wafer factory. Generally speaking, the wafer level packaging can meet the requirements of power consumption, cost, as well as light, thin, short and small for the electronic products. Especially, under more popularizing application of MEMS element, it will become main marketer for the growth of wafer level packaging industry, therefore attract the great input of professional wafer manufacturing and packaging industry.

However, the direct bonding is adopted in the conventional wafer level packaging technology. The bonding temperature is about 1000° C., and the working temperature of bonding is achieved by the whole heating way. The shortcoming of this way is that the high temperature may cause the abnormal function of other elements on the wafer. Even if some improvement technologies have been developed, such as the frit bonding or anodic bonding, the contact surface has to be treated specially before bonding to make the bonding surface flat and free of metal oxide layer. Some packaging technologies even need extra micro-heater to prevent damaging other elements, which not only will increase the manufacturing cost but also will waste much wafer area.

SUMMARY OF THE INVENTION

In view of the abovementioned description, a purpose of the present invention is to provide a wafer level packaging method for packaging a first wafer and a second wafer. The first wafer has an active side and a back side, and the active side has an unreleased MEMS element. The abovementioned packaging method comprises at least the following steps. The step of etching the first wafer to form at least two through silicon vias are performed first, and then these through silicon vias are filled. A first bonding ring and a first electrical interconnect are formed on the active side. The first electrical interconnect connects with one of the through silicon vias, the first bonding ring surrounds the MEMS element and connects with the other through silicon vias. Then, the electrical connection is formed on the second wafer and the first bonding ring and the first electrical interconnect correspond to a second bonding ring and a second electrical interconnect, separately. Upon packaging the first wafer and the second wafer, the second wafer is faced to the active side of the first wafer, the second bonding ring and the second electrical interconnect are connected with the first bonding ring and the first electrical interconnect, separately. And then, a voltage will be applied to the through silicon vias through the back side of the first wafer. An external force is also applied, to the second wafer to press it forward to the first wafer for packaging.

In an embodiment of the present invention, before etching the first wafer to form those through silicon vias, the following step is further included: Forming an etch stop layer on the active side. The etch stop layer includes a first metal material. Preferably, those through silicon vias are formed by etching the back side of the first wafer until the etch stop layer. Preferably, the first metal material of etch stop layer is electroplated to fill those through silicon vias.

In an embodiment of the present invention, in the step of forming the first bonding ring and the first electrical interconnect on the active side, the following steps are further included. Firstly, coating a first photoresist layer on the etch stop layer, and defining a first fillister and a second fillister for setting the first bonding ring and the first electrical interconnect, separately. Then, the first metal material is used to fill part of the first fillister and the second fillister, and the second metal material is used to fill the rest of the first fillister and the second fillister to form the first bonding ring and the first electrical interconnect. Finally, the first photoresist layer is removed. Preferably, the first metal material is nickel, and the second metal material is tin.

In an embodiment of the present invention, after the first photoresist layer is removed, the etch stop layer is also removed.

In an embodiment of the present invention, in the step of forming the electrical connection on the second wafer and the first bonding ring and the first electrical interconnect correspond to a second bonding ring and a second electrical interconnect, the following steps are further included. Firstly, coating a second photoresist layer on the second wafer, and defining a third fillister and a fourth fillister for setting the second bonding ring and the second electrical interconnect, separately. Then, the first metal material is used to fill part of the third fillister and the fourth fillister, and the second metal material is used to fill the rest of the third fillister and the fourth fillister to form the second bonding ring and the second electrical interconnect. Finally, the second photoresist layer is removed.

In an embodiment of the present invention, upon using the second metal material to fill the rest of the first fillister and the second fillister and removing the first photoresist layer, the steps for increasing the height of the first electrical interconnect are added. Firstly, a third photoresist layer is coated to cover the first photoresist layer and the second metal material. Then, the third photoresist layer covered on the first electrical interconnect is removed to form a fifth fillister, and the second metal material is used to fill the fifth fillister. Finally, the third photoresist layer is removed.

In an embodiment of the present invention, after etching the first wafer to form more than four through silicon vias, the following step is further included: Forming a metal wire at the back side of the first wafer to connect those through silicon vias, the first bonding ring and the first electrical interconnect on the active side, the second bonding ring and the second electrical interconnect on the second wafer. Then, after an external force is applied to the second wafer to press it forward to the first wafer for packaging, the following step is further included: Removing the metal wire.

In an embodiment of the present invention, the abovementioned wafer level packaging method further includes the following step: Releasing the MEMS element. Preferably, this step can be finished by a dry etching process or a wet etching process.

In an embodiment of the present invention, the step of etching the first wafer to form those through silicon vias is finished by a deep etching process.

In an embodiment of the present invention, an integrated circuit element is set on the second wafer, and the integrated circuit element is laid in the second electrical interconnect.

In an embodiment of the present invention, 3 to 4V is preferred for the applied voltage, and 2 MPa is preferred for the external force.

In an embodiment of the present invention, the abovementioned wafer level packaging method is performed at a vacuum environment.

Another purpose of the present invention is to provide a wafer level packaging method and a packaging structure, which comprises at least a first wafer and a second wafer. The first wafer has an active side and a back side, and the active side has at least a MEMS element, a first bonding ring and a first electrical interconnect. The first wafer has at least two through silicon vias. The first electrical interconnect connects with one of the through silicon vias, the first bonding ring surrounds the MEMS element and connects with the other through silicon vias. The second wafer has a second bonding ring and a second electrical interconnect. When the second wafer laps with the first wafer, the second electrical interconnect connects with the first bonding ring, and the second electrical interconnect connects with the first electrical interconnect, a voltage is applied to those through silicon vias at the back side of the first wafer for packaging the first wafer and the second wafer.

In an embodiment of the present invention, the first bonding ring, the second electrical interconnect, the first electrical interconnect, and the second electrical interconnect comprise a first metal material and a second metal material.

Therefore, the advantage and spirit of the present invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2A to FIG. 2I show the side view for a first embodiment of a wafer level packaging method along A-A' line of FIG. 1 according to the present invention;

FIG. 3A to FIG. 3C show the side view for an embodiment of a second wafer manufacturing process along A-A' line of FIG. 1 according to the present invention;

FIG. 5A to FIG. 5E show the side view for a second embodiment of a wafer level packaging method along A-A' line of FIG. 1 according to the present invention.

DESCRIPTION OF THE PREFERRED EMBODIMENT

Figure 1:
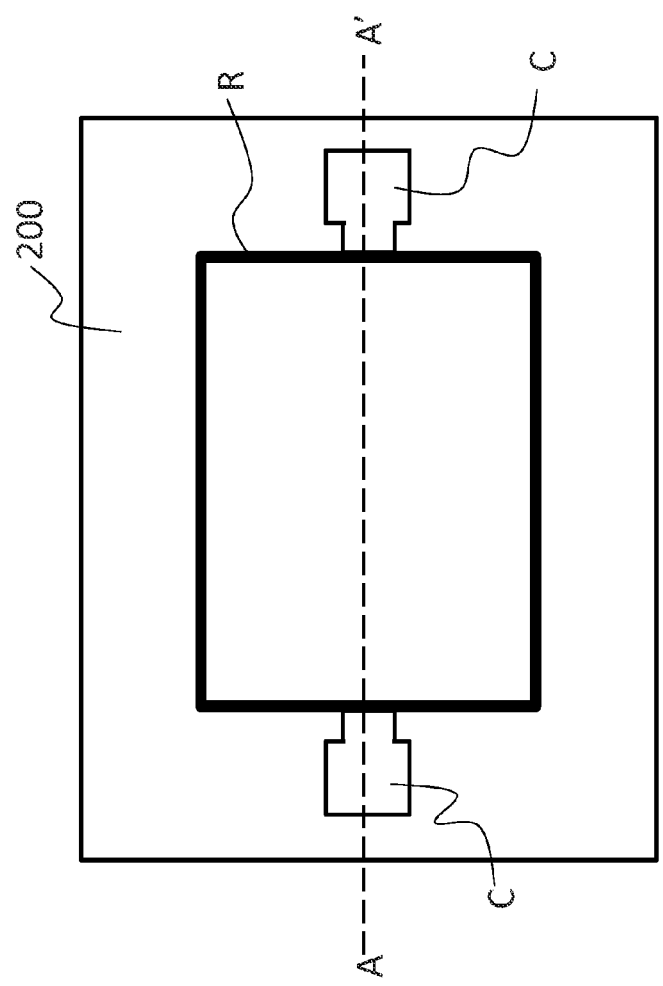
FIG. 1 is the top view for a preferred embodiment of a packaging structure according to the present invention.

In view of the bottleneck of the abovementioned conventional technique, such as the flatness requirement of bonding surface, the bonding temperature, the circuit design or the process complexity and so on, the wafer level packaging method and packaging structure adopts the resistance welding principle to bond the wafers. Simply speaking, the bonding rings are set on the wafer and the partial heating is performed to bond the wafers. In addition, this method combines the through silicon vias technique to finish the electrical interconnects of wafers. Please referring to FIG. 1, which is the top view for a preferred embodiment of a packaging structure according to the present invention. As shown in FIG. 1, the first wafer and the second wafer are combined by the bonding ring R. Meantime, the electrical interconnects C at both sides are also finished. The cross-sectional line A-A' shown in FIG. 1 will be used to further describe the wafer level packaging method provided by the present invention.

Figure 2B:
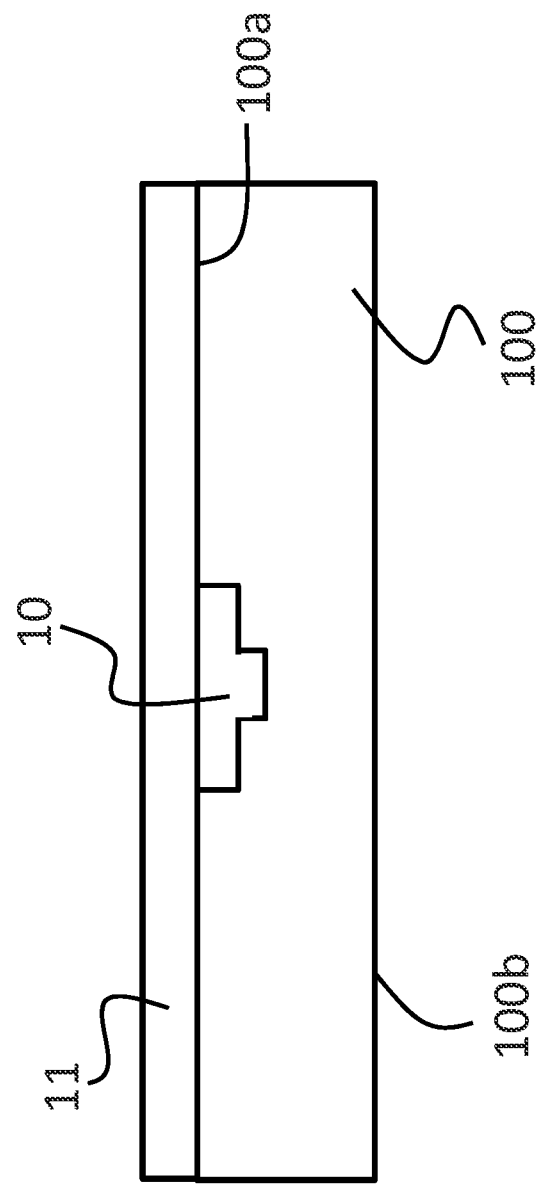

Please referring to FIG. 2A to FIG. 2I, which show the side view for a first embodiment of a wafer level packaging method along A-A' line of FIG. 1 according to the present invention. As shown in FIG. 2A, the first wafer 100 has an active side 100a and a back side 100b, and the active side 100a has an unreleased MEMS element 10.

Firstly, as shown in FIG. 2B, an etch stop layer 11 is formed on the active side 100a of the first wafer 100. Preferably, the etch stop layer 11 comprises a first metal material $M_1$.

Figure 2C:
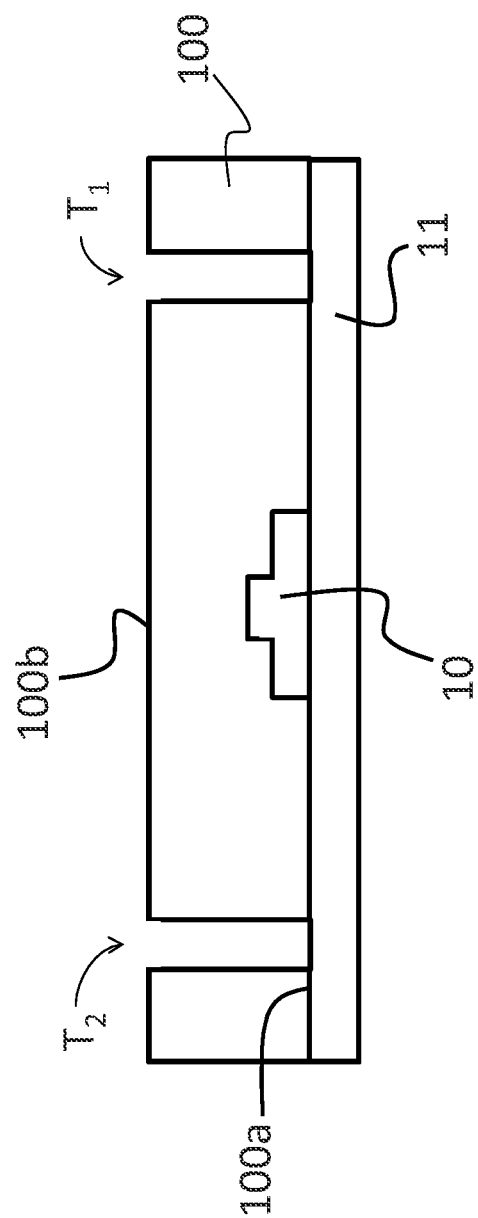

Then, as shown in FIG. 2C, etching the first wafer 100 started from the back side 100b of the first wafer 100 until the etch stop layer 11 to form at least two through silicon vias $T_1$, $T_2$. Preferably, a deep reactive ion etching (DRIE) is adopted to etch the first wafer 100 to form the through silicon vias $T_1$, $T_2$.

Figure 2D:
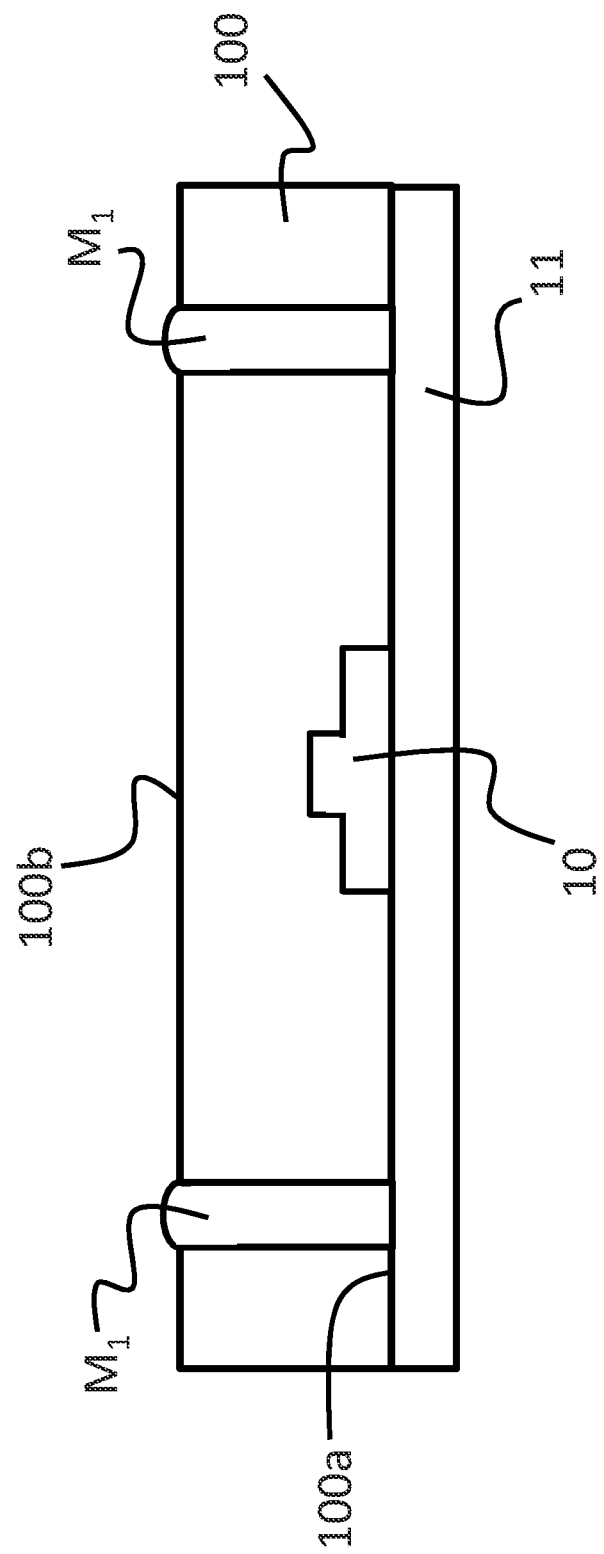

Then, as shown in FIG. 2D, the etch stop layer 11 is used as an electroplating seed layer to fill the first metal material $M_1$ into the through silicon vias $T_1$, $T_2$ by the electroplating process.

Figure 2E:
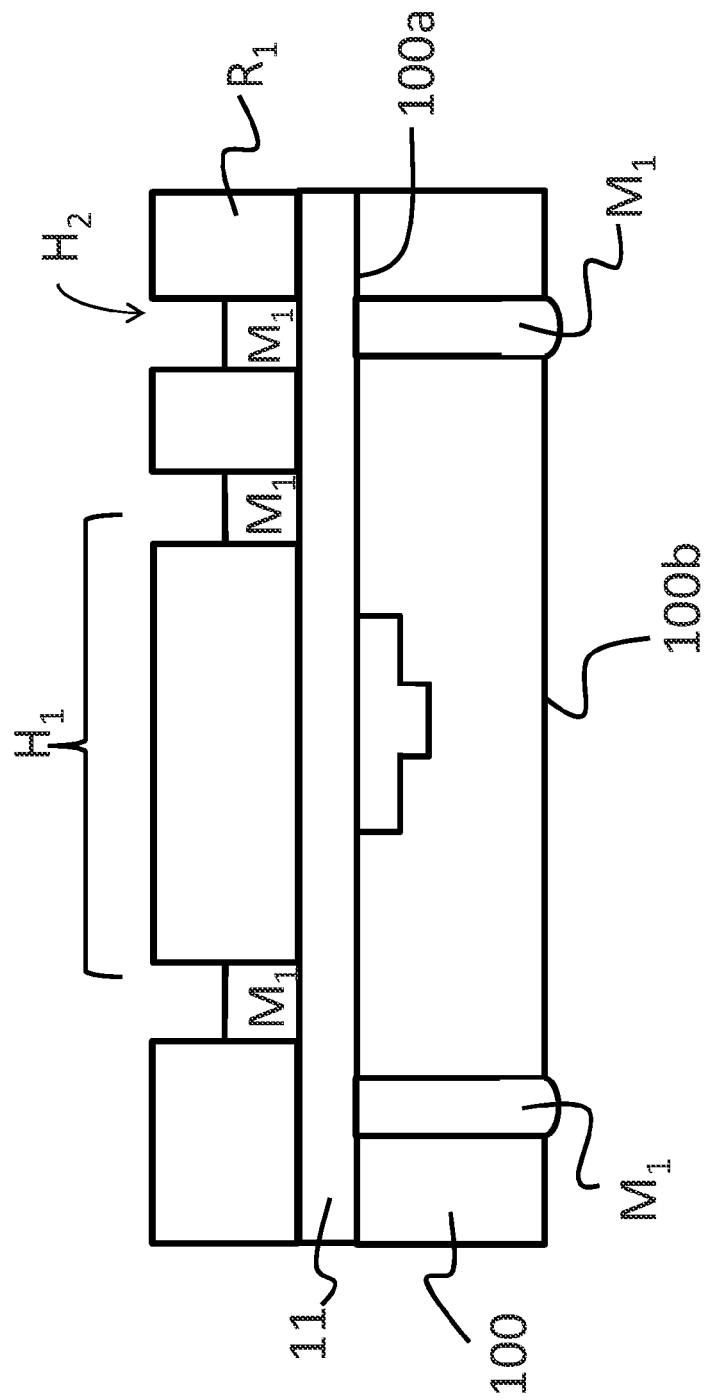

Please referring to FIG. 2E, after the through silicon vias $T_1$, $T_2$ are formed on the back side 100b of the first wafer 100 and extended to the etch stop layer 11 and the first metal material $M_1$ is used to fill the through silicon vias $T_1$, $T_2$, coat a first photoresist layer $R_1$ on the etch stop layer 11, and then define the first fillister $H_1$ and the second fillister $H_2$. In this embodiment, the position of the second fillister $H_2$ is corresponding to the through silicon vias $T_2$, which lies at the top of the through silicon vias $T_2$, in order to electrically connect the first electrical interconnect to the through silicon vias $T_2$.

Figure 2F:
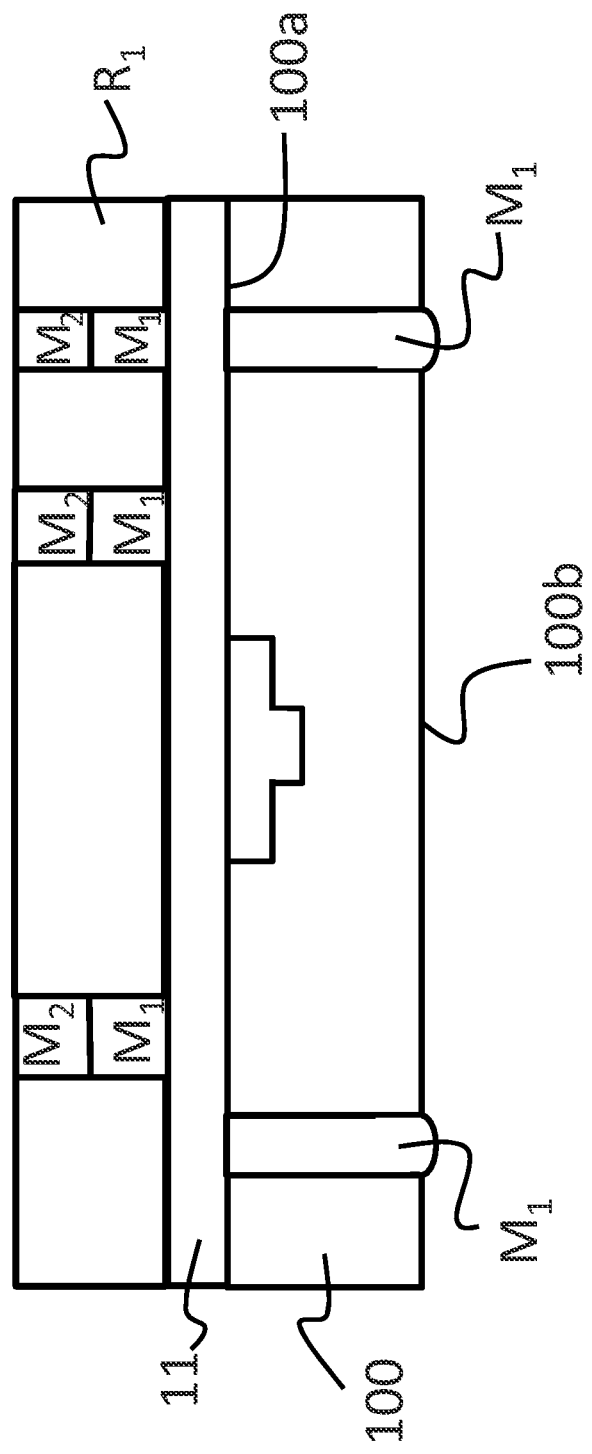

Then as shown in FIG. 2F, the first metal material $M_1$ is used to fill part of the first fillister $H_1$ and the second fillister $H_2$, and the second metal material $M_2$ is used to fill the rest of the first fillister $H_1$ and the second fillister $H_2$. Preferably, the first metal material is nickel, and the second metal material is tin. In addition, the ratio of the first metal material $M_1$ and the second metal material $M_2$ may be 1:1 preferably, but it is not limited in the present invention.

Figure 2G:
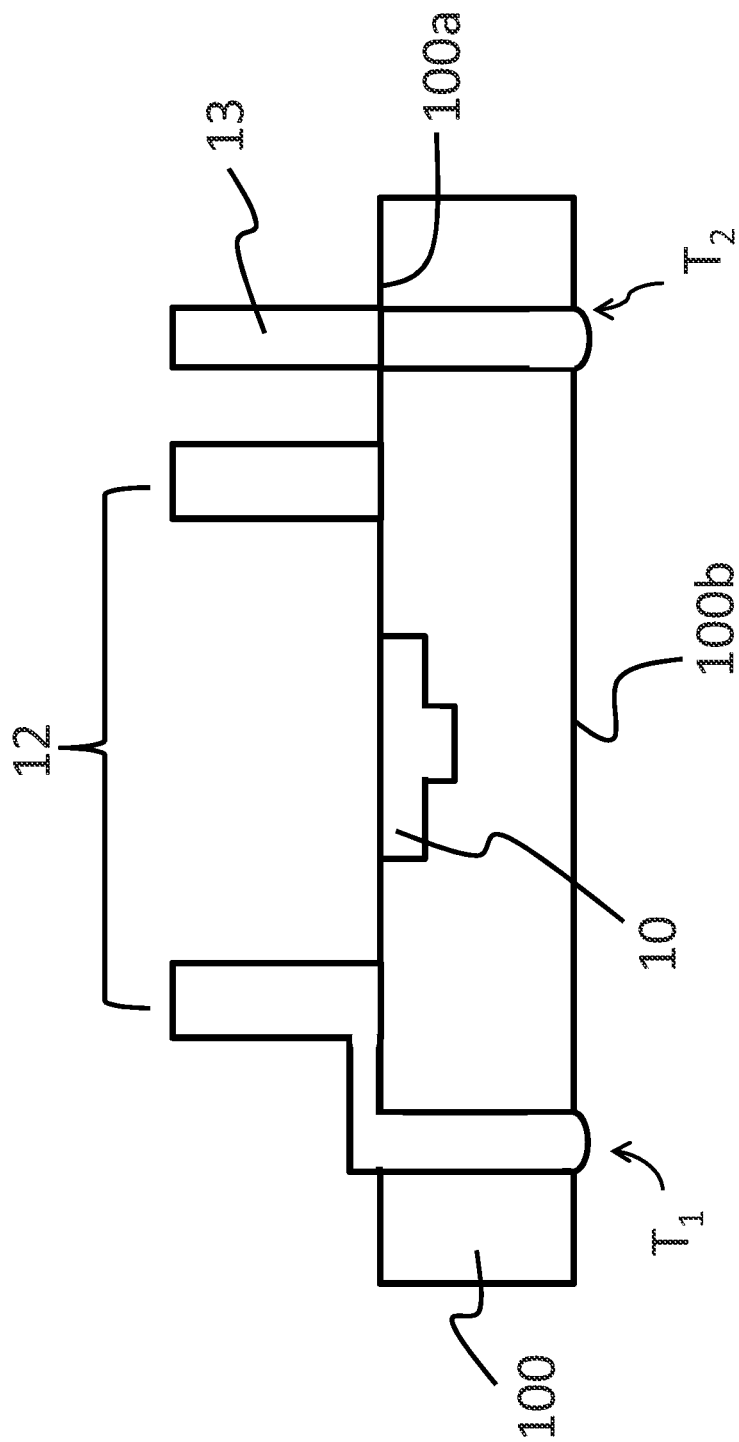

Finally as shown in FIG. 2G, after removing the first photoresist layer $R_1$ and the unshielded etch stop layer 11, the first metal material $M_1$ and the second metal material $M_2$ filled into the first fillister $H_1$ and the second fillister $H_2$ will form the first bonding ring 12 and the first electrical interconnect 13. As the abovementioned description, the first electrical interconnect 13 connects with the through silicon vias $T_2$, the first bonding ring 12 surrounds the MEMS element 10 and connects with the through silicon vias $T_1$. As shown in FIG. 2G, the first bonding ring 12 is represented by two cylinders, because FIG. 2A to FIG. 2I are shown by A-A' line of FIG. 1.

Figure 2H:
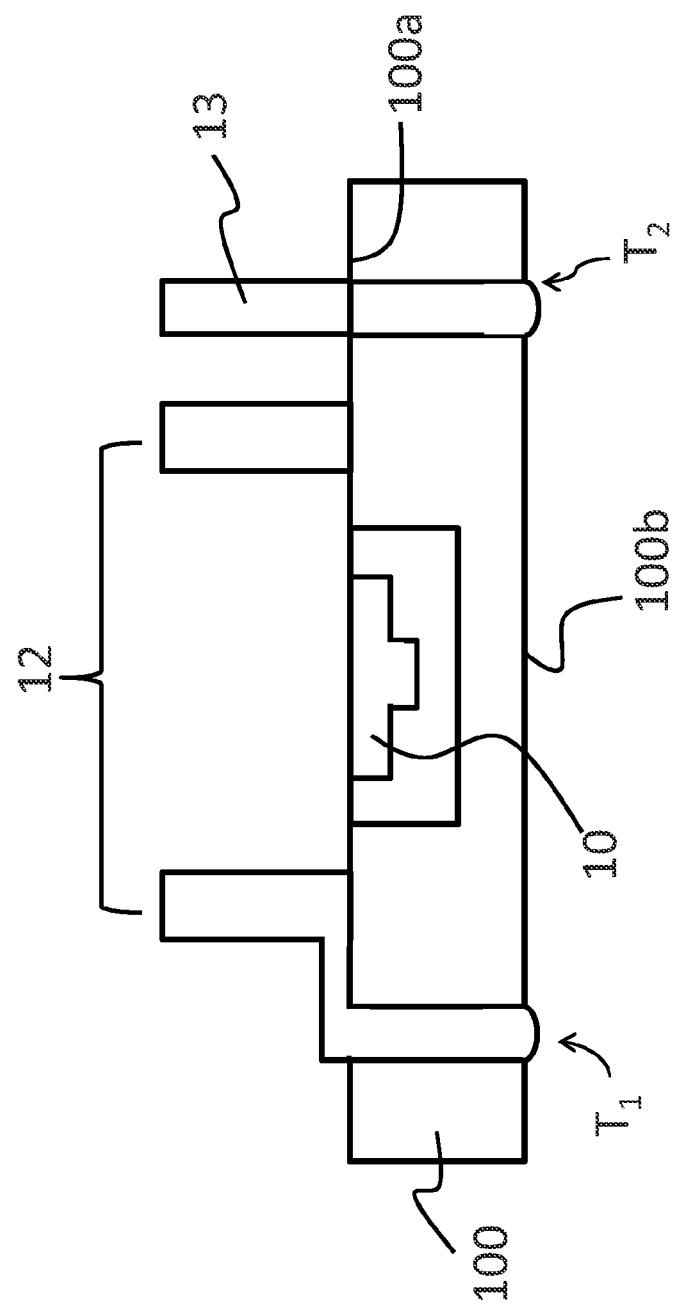

Please referring to FIG. 2H, after setting the first bonding ring 12 and the first electrical interconnect 13 on the first wafer 100, the MEMS element 10 is released. Preferably, this step can be finished by a dry etching process or a wet etching process, which is not limited in the present invention. Then the second wafer 200 will be corresponding to the first bonding ring 12 and the first electrical interconnect 13 on the first wafer 100, and a second bonding ring 22 and a second electrical interconnect 23 will be set on its first surface 200a. Preferably, the second bonding ring 22 and the second electrical interconnect 23 are electrically connected, and the process is the same as that specified in FIG. 2D to FIG. 2F.

Figure 2I:
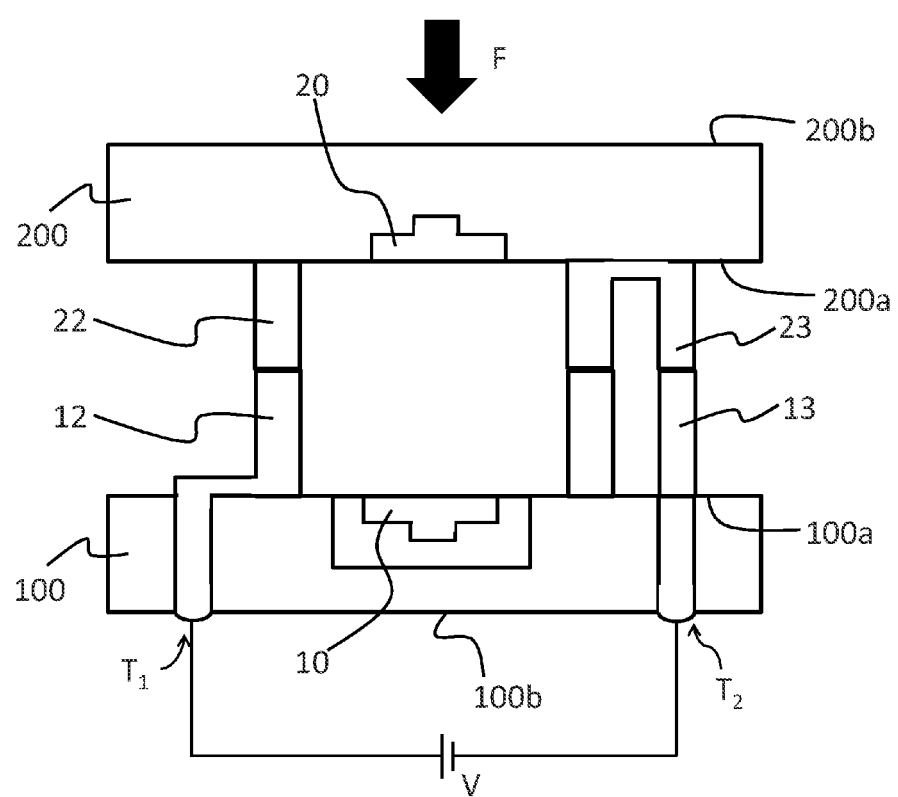

Please referring to FIG. 2I, upon packaging the first wafer 100 and the second wafer 200, first surface 200a of the second wafer 200 is faced to the active side 100a of the first wafer 100, and the second bonding ring 22 and the second electrical interconnect 23 are connected with the first bonding ring 12 and the first electrical interconnect 13, separately. It means that the second metal material $M_2$ in the second bonding ring 22 and the second electrical interconnect 23 of the second wafer 200 is connected with the second metal material $M_2$ in the first bonding ring 12 and the first electrical interconnect 13 of the first wafer 100 to form a metal/metal interface.

It has to describe that the present invention employs the resistance welding principle to bond two metals, because the contact resistance is higher at the uneven contact surface. In the equation. $P=I^2R$ (P: power, I: current, R: resistance), when a current is applied, most energy will be consumed at the contact resistance, and the contact surface of metals will be heated. When the temperature is raised to the bonding temperature, a longitudinal pressure is applied to bond two metals at melting state due to high temperature and high pressure. Thus, as the abovementioned description, when the second wafer 200 aligns with the first wafer 100, and the first bonding ring 12 connects with the second bonding ring 22, the first electrical interconnect 13 connects with the second electrical interconnect 23, a voltage V is applied to the through silicon vias $T_1$, $T_2$ at the back side 100b of the first wafer 100, so that a serial circuit is formed among the through silicon vias $T_1$, the first bonding ring 12, the second bonding ring 22, the second electrical interconnect 23, the first electrical interconnect 13 and the through silicon vias $T_1$, to reach partially heating purpose to raise the temperature between the metal/metal interface. When the voltage V is applied for a period of time, the second metal material $M_2$ will be started to melt. Meantime, when an external force F is applied to the second surface 200b of the second wafer 200 and the second wafer 200 is pressed forward to the first wafer 100, the second wafer 200 and the first wafer 100 will be bonded by the Transient Liquid Phase (TLP) for gas tight packaging. Preferable, the applied voltage is about 3 to 4V, the external force is about 2 MPa.

It has to further describe that the second wafer 200 can be an integrated circuit wafer, it means an integrated circuit element can be set on the second wafer 200. The integrated circuit element lies in the second bonding ring 22. At this time, the through silicon vias $T_2$ and the second electrical interconnect 23 can be used to electrically connect the integrated circuit on the second wafer 200 and the MEMS element 10 on the first wafer 100. It means that the signal output/input terminal of the integrated circuit element can be connected with the signal output/input terminal of the MEMS element 10 by the second electrical interconnect 23, and the through silicon vias $T_2$, and output/input the signal from the back side 100b of the first wafer 100. The method provided by the present invention not only can package the second wafer 200 and the first wafer 100 airtight, but also can electrically connect different wafers.

In addition, the wafer level packaging method provided by the present invention is preferred to be performed at a vacuum environment, so as to avoid the generation of void by the bubble generated upon heating.

Figure 3B:
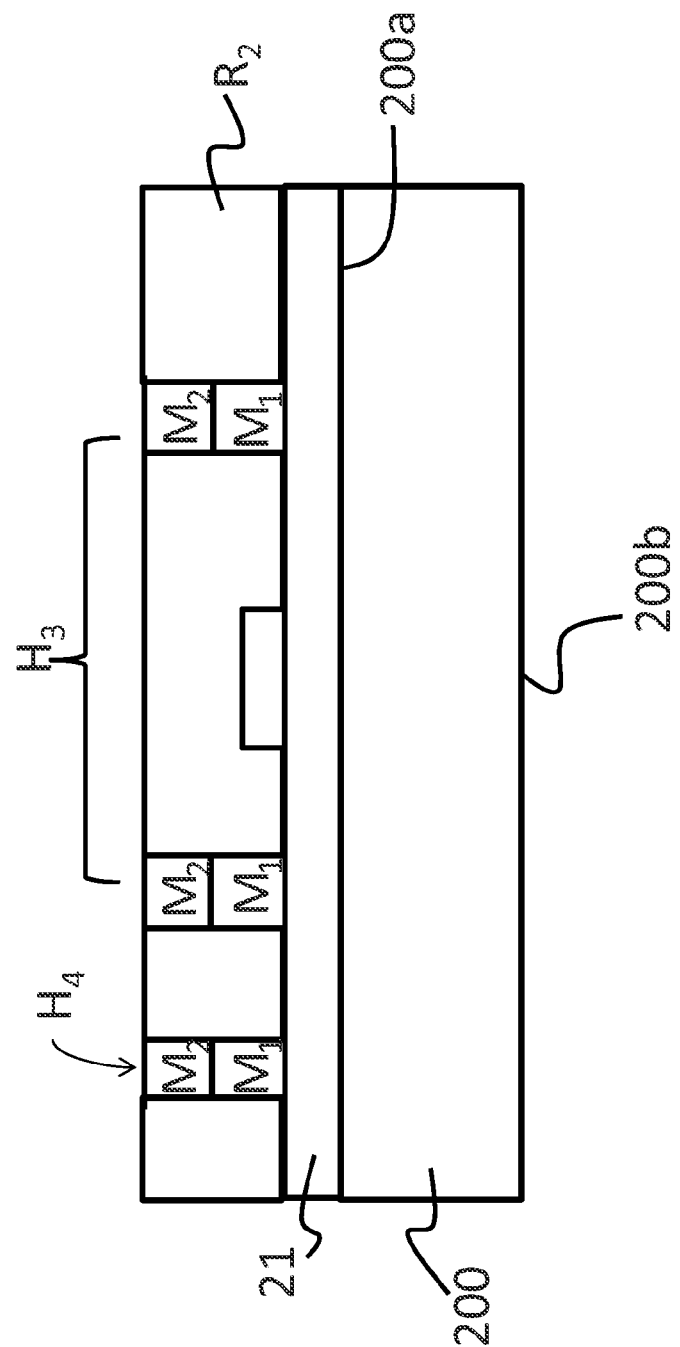

Please referring to FIG. 3A to FIG. 3C, which show the side view for an embodiment of a second wafer manufacturing process along A-A' line of FIG. 1 according to the present invention. Firstly, as shown in FIG. 3A, the second wafer 200 has an active side 200a and a second surface 200b, and the integrated circuit element 20 can be designed. Then, as shown in FIG. 3B, an electroplating seed layer 21 (i.e. the abovementioned etch stop layer 11 of the first wafer 100) and a second photoresist layer $R_2$ on the first surface of the second wafer 200. The second photoresist layer $R_2$ is defined to form a third fillister $H_3$ and a fourth fillister $H_4$. Then, the first metal material $M_1$ is used to fill part of the third fillister $H_3$ and the fourth fillister $H_4$, and the second metal material $M_2$ is used to fill the rest of the third fillister $H_3$ and the fourth fillister $H_4$. Finally, as shown in FIG. 3C, the second photoresist layer $R_2$ and the unshielded electroplating seed layer 21 are removed to form the electrically connected second bonding ring 22 and second electrical interconnect 23.

It has to further describe that the purpose of the abovementioned flow process is to state the concept of the wafer level, packaging method provided by the present invention. The flow process may be modified by manufacturing specific MEMS element, such as the number of through silicon vias, first bonding ring, first electrical interconnector or the manufacturing sequence, which is not limited in the above-mentioned embodiment of the present invention. For example, in the step of etching the first wafer 100 to form the through silicon vias (Please referring to FIG. 2C), when the number of through silicon vias is other than two, the number of the corresponding first electrical interconnect 13 and second electrical interconnect 23 of second wafer will be changed accordingly. Please referring to FIG. 4, which shows the side view for an embodiment of a packaging structure along A-A' line of FIG. 1 according to the present invention.

Figure 4:
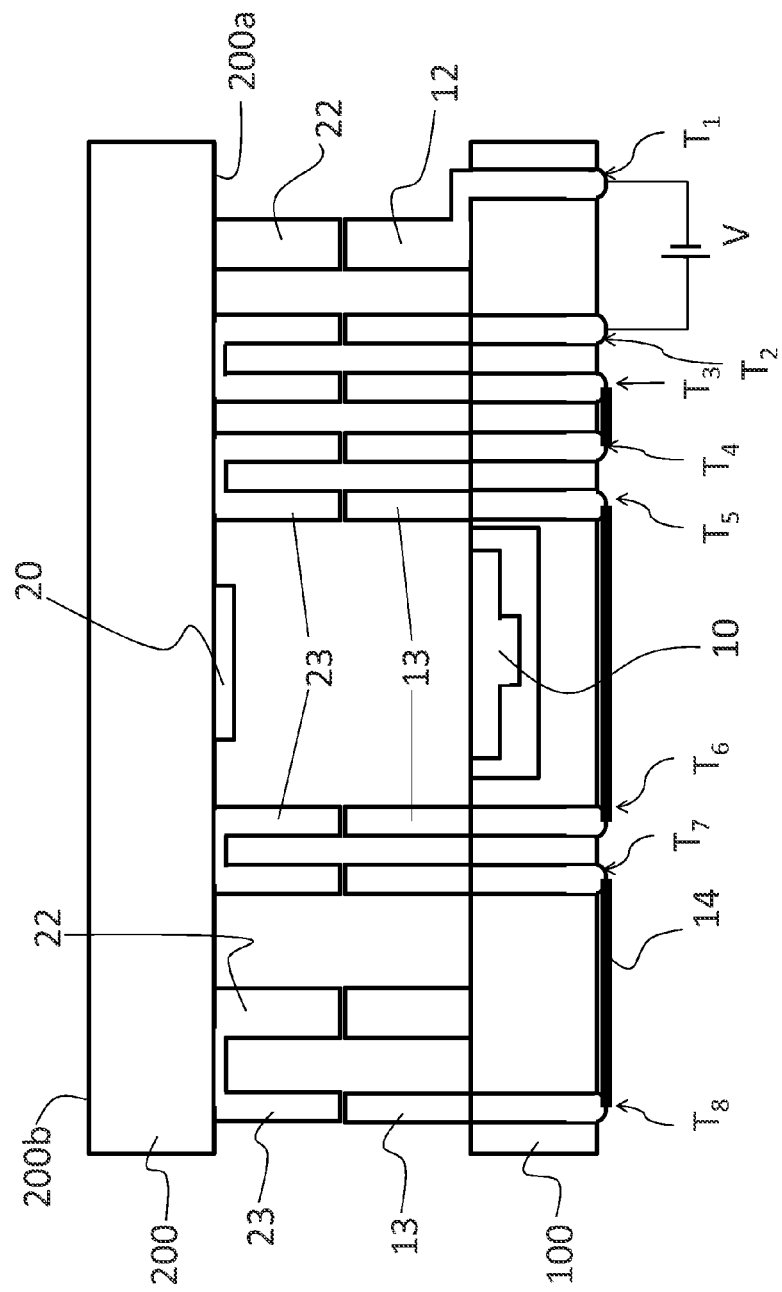
FIG. 4 shows the side view for an embodiment of a packaging structure along A-A' line of FIG. 1 according to the present invention.

As shown in FIG. 4, there are eight through silicon vias generated by etching the first wafer 100, and these through silicon vias are numbered as $T_1$~$T_8$ in series for facilitating the description. Wherein, the through silicon vias $T_1$ is electrically connected with the first bonding ring 12. Except, the first bonding ring 12, a plurality of first electrical interconnect 13 will be formed on the active side 100a of the first wafer 100 by the corresponding through silicon vias $T_2$~$T_8$. Meantime, a plurality of second electrical interconnect 23 will also be formed on the second wafer 200 by the corresponding first electrical interconnect 13. At this time, the wafer level packaging method provided by the present invention further comprises the following steps. A plurality of metal wire 14 are formed, at the back side 100b of the first wafer 100, and are electrically connected with the through silicon vias $T_3$ and the through silicon vias $T_4$, the through silicon vias $T_5$ and the through silicon vias $T_6$, the through silicon vias $T_7$ and the through silicon vias $T_8$. In addition, as for the second electrical interconnect 23 on the second wafer 200, except one of them is electrically connected with the second bonding ring 22, the others are connected in similar pair. The purpose is to make the first bonding ring 12, the first electrical interconnect 13, the second bonding ring 22, the second electrical interconnect 23 and the through silicon vias $T_1$~$T_8$ become a serial circuit. It means that when a voltage V is applied to the through silicon vias $T_1$, $T_2$ at the back side 100b of the first wafer 100, the current will flow through the through silicon vias $T_2$, the first electrical interconnect 13, the second electrical interconnect 23, the second electrical interconnect 23, the first electrical interconnect 13, the through silicon vias $T_3$, the through silicon vias $T_4$, the first electrical interconnect 13, the second electrical interconnect 23, the second electrical interconnect 23, the through silicon vias $T_5$, the through silicon vias $T_6$, the first electrical interconnect 13, the second electrical interconnect 23, the second electrical interconnect 23, the through silicon vias $T_7$, the through silicon vias $T_8$, the first electrical interconnect 13, the second electrical interconnect 23, second bonding ring 22, the first bonding ring 12, and the through silicon vias $T_1$.

However, it has to pay attention to that after the packaging of the second wafer 200 and the first wafer 100, the metal wire 14 has to be removed to electrically separate the through silicon vias $T_1$~$T_8$, the first bonding ring 12 and the first electrical interconnect 13.

Please referring to FIG. 5A to FIG. 5E, which show the side view for a second embodiment of a wafer level packaging method along A-A' line of FIG. 1 according to the present invention. As shown in FIG. 2A, the first wafer 100 has an active side 100a and a back side 100b, and the active side 100a has an unreleased MEMS element 10. Basically, the steps are almost the same for the second embodiment and the first embodiment. The only difference is that the first electrical interconnect 13 is higher than the first bonding ring 12 on the first water 100 of the second embodiment. Then, FIG. 4 will be used as the basis for the wafer level packaging method of the second embodiment (i.e. the first wafer 100 has the through silicon vias $T_1$~$T_8$), which will be further described as follows.

Figure 5A:
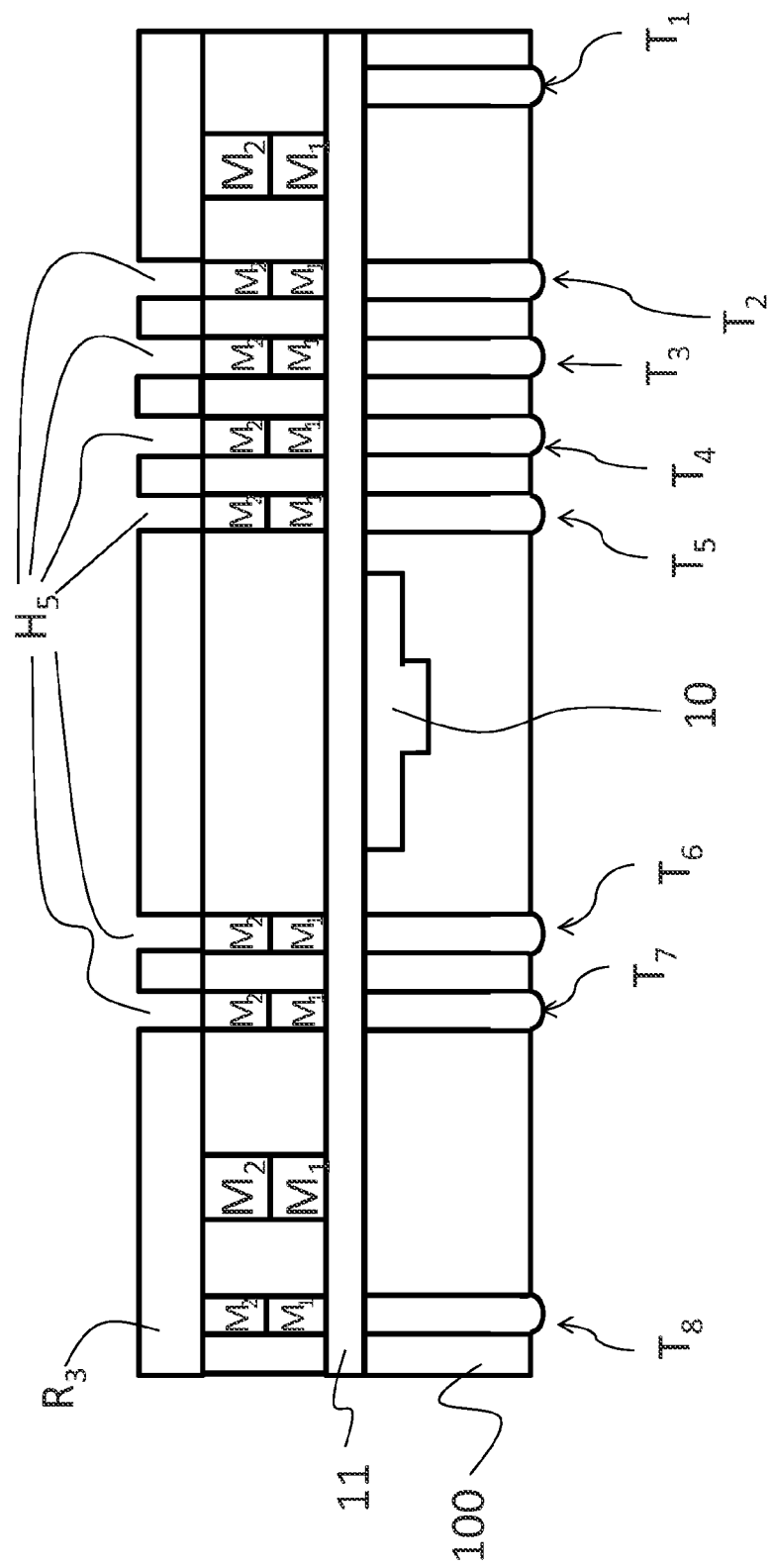

Firstly, please referring to FIG. 5A, after filling the rest space of the first fillister $H_1$ and the second fillister $H_2$ by the second metal material $M_2$ (please referring to FIG. 2F), coat a third photoresist layer $R_3$ to cover the first photoresist layer $R_1$ and the second metal material $M_2$. Then, remove the third photoresist layer $R_3$ covered on the first electrical interconnect 13 to form a fifth fillister $H_5$. Then, as shown in FIG. 5B, use a second metal material $M_2$ to fill the fifth fillister $H_5$.

Figure 5C:
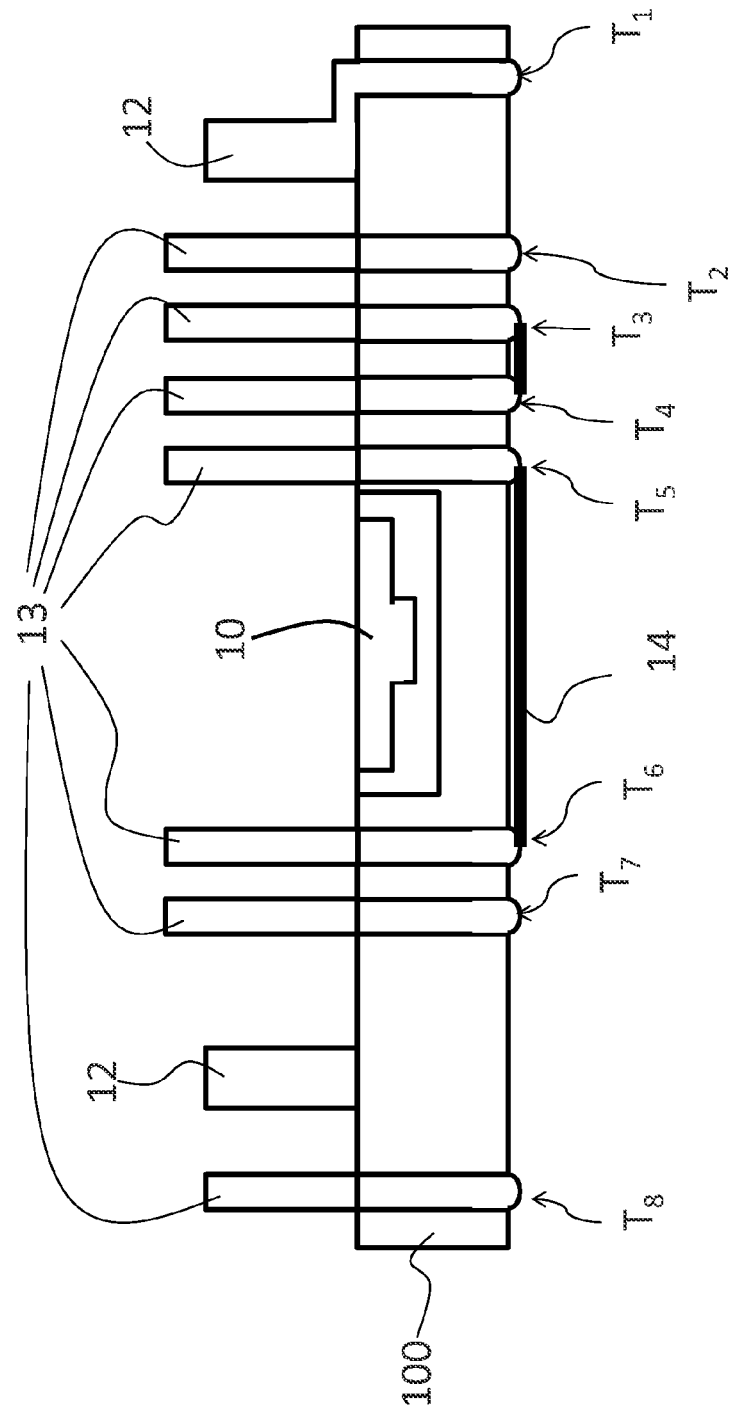

Please referring to FIG. 5C, remove the third photoresist layer, the first photoresist layer and the unshielded etch stop layer 11 to complete the layout of the first wafer 100. Meantime, as the above-mentioned purpose, in order to form a serial circuit during packaging process, a plurality of metal wire 14 can be electrically connected with the through silicon vias $T_3$ and through silicon vias $T_4$, the through silicon vias $T_5$ and the through silicon vias $T_6$ in the second embodiment.

Figure 5D:
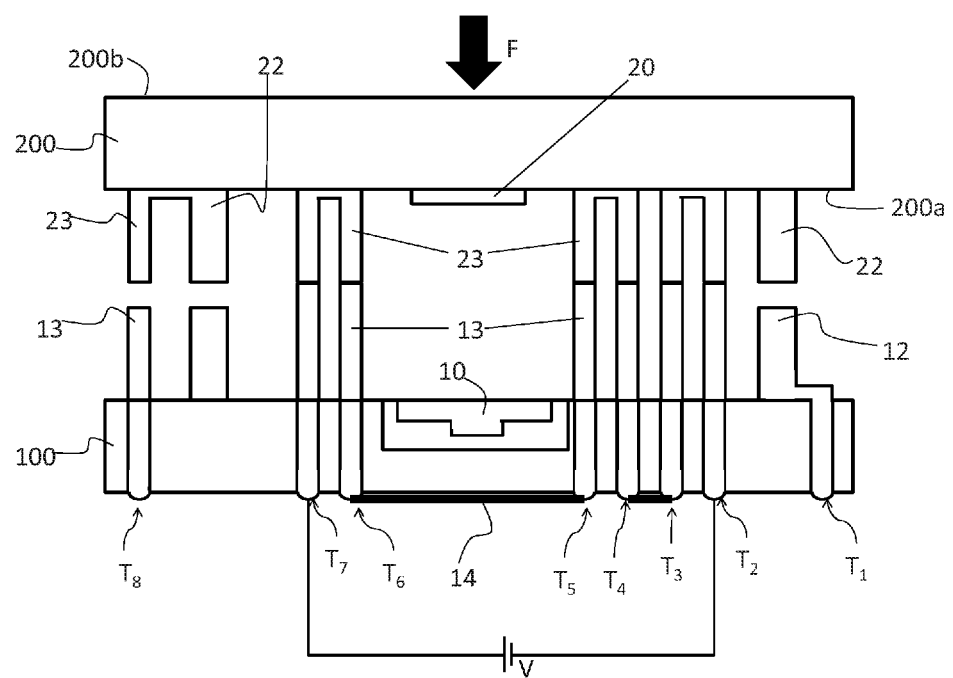

Please referring to FIG. 5D, the second wafer 200 provided here is also corresponding to the first bonding ring 12 and the first electrical interconnect 13 on the first wafer 100, and a second bonding ring 22 and a plurality of second electrical interconnect 23 are set as described above. Basically, when the first surface 200a of the second wafer 200 is faced to the active side 100a of the first water 100, the second electrical interconnect 23 will contact higher first electrical interconnect 13, the application of voltage can be performed in two steps. Firstly, apply a voltage V by the through silicon vias $T_2$ and $T_7$, so that most first electrical interconnect 13 and second electrical interconnect 23 form a channel. It means the first electrical interconnect 13 and the second electrical interconnect 23 are bonded first in the second embodiment.

Figure 5E:
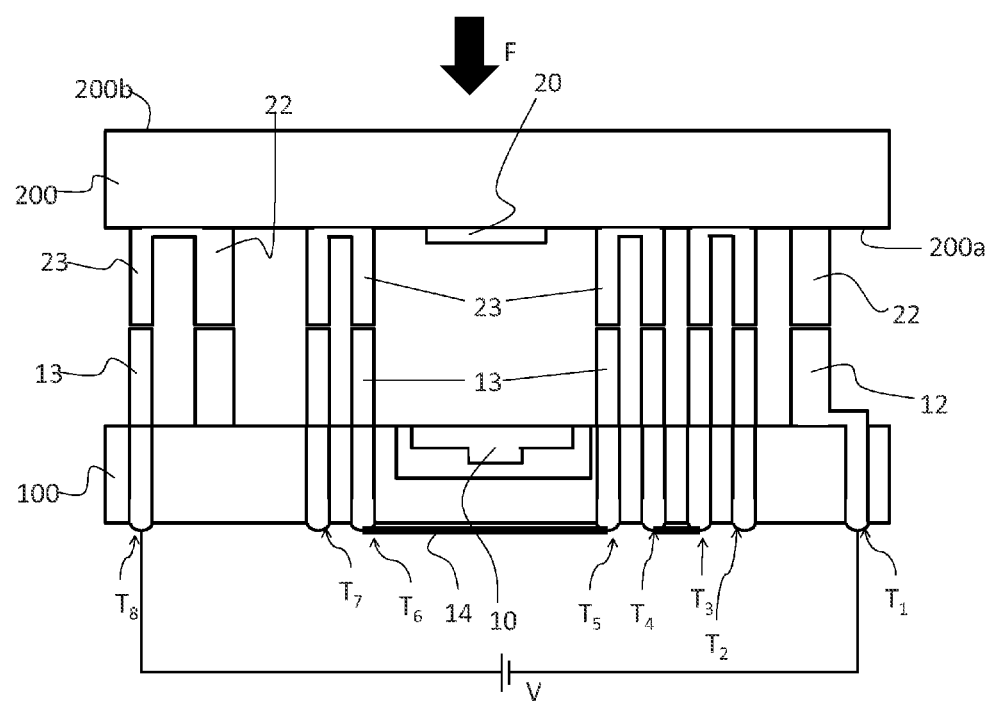

Then, please referring to FIG. 5E, after the second electrical interconnect 23 and the first electrical interconnect 13 are melted and bonded, the first bonding ring 12 will contact the second bonding ring 22. At this time, apply another voltage V by the through silicon vias $T_1$ and $T_8$ to bond the first bonding ring 12 and the second bonding ring 22 for completing the air tight packaging of the first wafer 100 and the second wafer 200.

As the abovementioned description, because the main purpose of the first electrical interconnect 13 and the second electrical interconnect 23 is to electrically connect the MEMS element of the first wafer and the integrated circuit of the second wafer, thus the second electrical interconnect 23 and the first electrical interconnect 13 are bonded first in the second embodiment. The exposed through silicon vias at the back side 100b of the first wafer 100 can be tested in advance, in order to assure if the packaging of wafers is air tight. It means that when the method of the second embodiment is adopted, the defect of circuit can be found before the air tight packaging, in order to avoid processing repetition and cost waste and so on.

Summarized from the abovementioned description, the wafer level packaging method provided by the present invention uses the resistance welding concept for the packaging of electronics/MEMS system. As the abovementioned description, the bonding ring and the through silicon vias are designed on a wafer, and the corresponding metal electrodes are designed on another wafer, in order to provide the metal/metal contact for the bonding of these two wafers. Because the resistance is higher at the metal/metal contact surface, the resistance welding can be used to partially heat the metal/metal contact surface of the bonding ring and the metal/metal contact surface of the through silicon vias, in order to perform the Transient Liquid Phase (TLP) bonding. It means that the air tight packaging of two wafers can be finished by bonding the bonding ring, and the electrical connection of the integrated circuit and the MEMS element can be finished by bonding the through silicon vias.

As the abovementioned description, because the higher contact resistance is used for the bonding in the present invention, the roughness of metal surface in not important, thus the cheaper process can be adopted. In addition, due to the present invention adopts partial heating method, partial temperature may be higher without damaging other elements on the wafer, thus more bonding metals can be selected and the limit of MEMS element design is less. Finally, because the input/output points are exposed (i.e. the back side 100b of the first wafer 100) after packaging in the present invention, thus the wafer level test can be performed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all, features that would be treated as equivalents thereof by those skilled in the art to which this invention pertains.

The invention claimed is:
1. A wafer level packaging method for packaging a first wafer and a second wafer, wherein the first wafer having an active side and a back side, and the active side having a MEMS element, the packaging method comprises:

etching the first wafer to form a plurality of through silicon vias;

filling the plurality of through silicon vias;

forming a first bonding ring and a first electrical interconnect on an active side, the first electrical interconnect connecting with one of the plurality of through silicon vias, the first bonding ring surrounding the MEMS element and connecting with another of the through silicon vias;

forming an electrical connection on a second wafer and the first bonding ring and the first electrical interconnect corresponding to a second bonding ring and a second electrical interconnect separately;

facing the second wafer to the active side of the first wafer, the second bonding ring and the second electrical interconnect being connected with the first bonding ring and the first electrical interconnect separately;

applying a voltage to the plurality of through silicon vias through the back side of the first wafer; and applying an external force to the second water and pressing it forward to the first wafer.

2. The method according to claim 1, wherein before etching the first wafer to form the plurality of through silicon vias, the following step further comprising:

forming an etch stop layer on the active side, wherein the etch stop layer comprises a first metal material.

3. The method according to claim 2, wherein the step of etching the first wafer to form the plurality of through silicon vias, the plurality of through silicon vias are formed by etching the back side of the first wafer until the etch stop layer.

4. The method according to claim 2, wherein filling the plurality of through silicon vias comprises using the first metal material of etch stop layer to achieve an electroplating process.

5. The method according to claim 2, wherein in the step of forming the first bonding ring and the first electrical interconnect on the active side, further comprises:

coating a first photoresist layer on the etch stop layer;

separately defining a first fillister and a second fillister for setting the first bonding ring and the first electrical interconnect;

using the first metal material to fill a part of the first fillister and the second fillister;

using the second metal material to fill a rest of the first fillister and the second fillister to form the first bonding ring and the first electrical interconnect; and removing the first photoresist layer.

6. The method according to claim 5, wherein the first metal material is nickel, and the second metal material, is tin.

7. The method according to claim 5, wherein after the first photoresist layer is removed, further comprises:

removing the etch stop layer.

8. The method according to claim 5, wherein the step of forming the electrical connection on the second wafer and the first bonding ring and the first electrical interconnect correspond to a second bonding ring and a second electrical interconnect, further comprises:

coating a second photoresist layer on the second wafer;

separately defining a third fillister and a fourth fillister for setting the second bonding ring and the second electrical interconnect;

using the first metal material to fill a part of the third fillister and the fourth fillister;

using the second metal material to fill a rest of the third fillister and the fourth fillister to form the second bonding ring and the second electrical interconnect; and removing the second photoresist layer.

9. The method according to claim 5, wherein upon using the second metal material to fill the rest of the first fillister and the second fillister and removing the first photoresist layer, further comprising:

coating a third photoresist layer to cover the first photoresist layer and the second metal material;

removing the third photoresist layer covered on the first electrical interconnect to form a fifth fillister;

using the second metal material to fill the fifth fillister; and removing the third photoresist layer.

10. The method according to claim 1, wherein after etching the first wafer to form the plurality of through silicon vias, further comprising:

forming a metal wire at the back side of the first wafer to connect the plurality of through silicon vias, the first bonding ring and the first electrical interconnecting on the active side, the second bonding ring and the second electrical interconnecting on the second wafer.

11. The method according to claim 1, wherein after applying an external force to the second wafer and pressing forward to the first wafer, further comprising:

removing a metal wire.

12. The method according to claim 1, further comprising:

releasing an MEMS element.

13. The method according to claim 12, wherein the step of releasing the MEMS element is selected from the group consisting of by a dry etching process and a wet etching process.

14. The method according to claim 1, wherein the step of etching the first wafer to form the plurality of through silicon vias comprises by a deep etching process.

15. The method according to claim 1, wherein the second wafer having an integrated circuit element, and the integrated circuit element is laid in the second electrical interconnect.

16. The method according to claim 1, wherein the voltage is 3V to 4V.

17. The method according to claim 1, wherein the external force is about 2 MPa.

18. The method according to claim 1, wherein the method is under vacuum environment.

19. The packaging structure formed according to claim 1, comprising:

a first wafer, the first wafer having an active side and a back side, the active side having at least a MEMS element, a first bonding ring and a first electrical interconnect, the first wafer having at least two through silicon vias, the first electrical interconnect connecting with one of the two through silicon vias, the first bonding ring surrounding the MEMS element and connecting with another through silicon vias; and a second wafer having a second bonding ring and a second electrical interconnect;

wherein the second wafer laping with the first wafer, the second electrical interconnect connecting with the first bonding ring, the second electrical interconnect connecting with the first electrical interconnect, a voltage being applied to the two through silicon vias at the back side of the first wafer.

20. The packing structure according to claim 19, wherein the first bonding ring, the second electrical interconnect, the first electrical interconnect and the second electrical interconnect comprise a first metal material and a second metal material.

* * * * *